(12) United States Patent
Atwood et al.

(10) Patent No.: US 11,317,505 B2
(45) Date of Patent: Apr. 26, 2022

(54) DOUBLE-SIDED, HIGH-DENSITY NETWORK FABRICATION

(71) Applicant: RAYTHEON COMPANY, Waltham, MA (US)

(72) Inventors: Brian K. Atwood, Murphy, TX (US); Thang D. Nguyen, Wylie, TX (US); Sankerlingam Rajendran, Plano, TX (US); Douglas R. Gentry, Plano, TX (US); Walter B. Aschenbeck, Jr., Dallas, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 17/178,945

(22) Filed: Feb. 18, 2021

(65) Prior Publication Data
US 2021/0321511 A1 Oct. 14, 2021

Related U.S. Application Data

(62) Division of application No. 16/844,586, filed on Apr. 9, 2020.

(51) Int. Cl.
H05K 1/02 (2006.01)
H05K 1/03 (2006.01)
(Continued)

(52) U.S. Cl.
CPC ......... H05K 1/0237 (2013.01); H05K 1/0353 (2013.01); H05K 1/115 (2013.01);
(Continued)

(58) Field of Classification Search
CPC .... H05K 1/0237; H05K 1/0353; H05K 1/115; H05K 3/0026; H05K 3/4038; H05K 3/4644; H05K 2201/0141; H05K 2203/107
See application file for complete search history.

(56) References Cited

U.S. PATENT DOCUMENTS 4,585,502 A    4/1986  Uozo et al.
5,153,987 A   10/1992  Takashi et al.
(Continued)

FOREIGN PATENT DOCUMENTS

WO    2017104623 A1    6/2017

OTHER PUBLICATIONS

Edwin, C. Culbertson: "A New Laminate Material for High Performance PCBS: Liquid Crystal Polymer Copper Clad Films", Proceedings of the 45th Electronic Components and Tehnology Conference, Las Vegas., ISBN: 978-0-7803-2736-8; Jan. 1, 1995; pp. 520-523.
(Continued)

Primary Examiner — Carl J Arbes
(74) Attorney, Agent, or Firm — Cantor Colburn LLP

(57) ABSTRACT

A conductive network fabrication process is provided and includes filling a hole formed in a substrate with dielectric material, laminating films of the dielectric material on either side of the substrate, opening a through-hole through the dielectric material at the hole, depositing a conformal coating of dielectric material onto an interior surface of the through-hole and executing seed layer metallization onto the conformal coating in the through-hole to form a seed layer extending continuously along an entire length of the through-hole.

20 Claims, 3 Drawing Sheets

(51) Int. Cl.
   *H05K 1/11*   (2006.01)
   *H05K 3/00*   (2006.01)
   *H05K 3/40*   (2006.01)
   *H05K 3/46*   (2006.01)

(52) U.S. Cl.
   CPC ......... *H05K 3/0026* (2013.01); *H05K 3/4038* (2013.01); *H05K 3/4644* (2013.01); *H05K 2201/0141* (2013.01); *H05K 2203/107* (2013.01)

(56) References Cited

U.S. PATENT DOCUMENTS

| | | | |
|---|---|---|---|
| 5,719,354 A | 2/1998 | Jester et al. | |
| 6,936,906 B2* | 8/2005 | Chung | C23C 14/046 |
| | | | 257/485 |
| 6,987,307 B2 | 1/2006 | White et al. | |
| 7,432,195 B2 | 10/2008 | Suzuki | |
| 8,043,796 B2 | 10/2011 | Akimoto | |
| 8,053,861 B2* | 11/2011 | Mountsier | H01L 23/53295 |
| | | | 257/510 |
| 8,138,082 B2* | 3/2012 | Torres | H01L 21/76835 |
| | | | 438/618 |
| 8,152,950 B2 | 4/2012 | Tsugaru et al. | |
| 8,178,191 B2 | 5/2012 | Nishino et al. | |
| 8,563,431 B2 | 10/2013 | Miyairi et al. | |
| 9,006,101 B2* | 4/2015 | Chen | H01L 23/5226 |
| | | | 438/637 |
| 9,112,007 B2* | 8/2015 | Lin | H01L 23/3171 |
| 9,398,703 B2 | 7/2016 | Karavakis et al. | |
| 9,698,131 B2 | 7/2017 | Sanders et al. | |
| 10,568,216 B2 | 2/2020 | Ohata | |
| 11,096,271 B1* | 8/2021 | Atwood | H05K 1/115 |
| 2002/0172021 A1 | 11/2002 | Seri et al. | |
| 2007/0117377 A1* | 5/2007 | Yang | H01L 21/76865 |
| | | | 438/638 |

OTHER PUBLICATIONS

International Search Report and Written Opinion Application No. PCT/US2021/016028; dated May 17, 2021; pp. 16.
J. Weichart et al.: PVD Processes in High Aspect Ratio Features by HIPIMS; Materials and Engineering Research Institute, Sheffield Hallam University; UK, pp. 6.

* cited by examiner

DOUBLE-SIDED, HIGH-DENSITY NETWORK FABRICATION

CROSS-REFERENCE TO RELATED APPLICATION

This application is a Divisional Application of U.S. application Ser. No. 16/844,586 filed Apr. 9, 2020, the entire disclosure of which is incorporated herein by reference.

BACKGROUND

The present disclosure relates to network fabrication and, in particular, to double-sided, high-density radio frequency (RF)/direct current (DC) network fabrication on a metal substrate.

The ability of systems and processes to create double-sided, high-density networks has been traditionally limited by several factors. In general, planarity of dielectric surfaces has been difficult to achieve because dielectric planarity is typically dependent on lamination/extrusion processes that often produce depression on one side of a substrate and protrusions on the other side of the substrate. This topology tends to lead to extensive patterning defects at photolithography stages. In addition, metal coverage of through-substrate coaxial vias is difficult to achieve because through-hole metallization can be marginally effective. This is often due to limited throwing power of metal deposition processes.

Attempts to overcome these factors have included processes whereby a plasma etch is applied to the protrusions to minimize the bump and multiple extrusion/lamination cycles were attempted with substrate flipping. While these realized improvements in terms of reducing the depression and protrusion formation, they did not eliminate depressions and protrusions entirely. Meanwhile, dielectric via metallization was attempted using two-step sputter deposition processes to deposit metal from both sides of the substrate.

SUMMARY

According to an aspect of the disclosure, a conductive network fabrication process is provided and includes filling a hole formed in a substrate with dielectric material, laminating films of the dielectric material on either side of the substrate, opening a through-hole through the dielectric material at the hole, depositing a conformal coating of dielectric material onto an interior surface of the through-hole and executing seed layer metallization onto the conformal coating in the through-hole to form a seed layer extending continuously along an entire length of the through-hole.

In accordance with additional or alternative embodiments, the dielectric material filling the hole is flush with substrate surfaces and interior and exterior surfaces of each of the films are substantially flat.

In accordance with additional or alternative embodiments, the through-hole is a high-aspect ratio through-hole.

In accordance with additional or alternative embodiments, the opening of the through-hole includes lasing.

In accordance with additional or alternative embodiments, the depositing of the conformal coating includes atomic layer deposition (ALD) of alumina.

In accordance with additional or alternative embodiments, the executing of the seed layer metallization includes high power impulse magnetron sputtering (HiPIMS).

In accordance with additional or alternative embodiments, the HiPIMS is executed sequentially at opposite sides of the substrate.

In accordance with additional or alternative embodiments, a thickness of the seed layer is about 10× a thickness of the conformal coating.

In accordance with additional or alternative embodiments, a thickness of at least the seed layer is substantially uniform along the entire length of the through-hole.

In accordance with additional or alternative embodiments, the method further includes forming network conductors on exterior surfaces of the films in electrical communication with the seed layer.

According to an aspect of the disclosure, a conductive network fabrication process is provided and includes filling holes formed in a substrate with liquid crystal polymer (LCP), laminating films of LCP on either side of the substrate, lasing through-holes through the LCP at each of the holes, depositing, by atomic layer deposition (ALD), conformal coatings of alumina onto interior surfaces of each of the through-holes and executing high power impulse magnetron sputtering (HiPIMS) to form, on the conformal coatings, seed layers extending continuously along entire lengths of each of the through-holes.

In accordance with additional or alternative embodiments, the LCP in the holes is flush with substrate surfaces and interior and exterior surfaces of each of the films of LCP are substantially flat.

In accordance with additional or alternative embodiments, the through-holes are high-aspect ratio through-holes.

In accordance with additional or alternative embodiments, the HiPIMS is executed sequentially at opposite sides of the substrate.

In accordance with additional or alternative embodiments, thicknesses of the seed layers are about 10× thicknesses of the conformal coatings.

In accordance with additional or alternative embodiments, thicknesses of at least the seed layers are substantially uniform along the entire lengths of each of the through-holes.

In accordance with additional or alternative embodiments, the method further includes forming network conductors on exterior surfaces of the films in electrical communication with the seed layers.

According to an aspect of the disclosure, a double-sided, high-density radio frequency (RF)/direct current (DC) network is provided and includes a substrate defining holes, liquid crystal polymer (LCP) lining each of the holes and forming substantially flat films on opposite surfaces of the substrate, the LCP defining through-holes at each of the holes, conformal coatings of alumina respectively disposed on the LCP in each of the through-holes and seed layers respectively disposed on the conformal coatings to respectively extend continuously along entire lengths of the through-holes.

In accordance with additional or alternative embodiments, the through-holes are high-aspect ratio through-holes and thicknesses of at least the seed layers are substantially uniform along the entire lengths of the through-holes.

In accordance with additional or alternative embodiments, network conductors are provided on exterior surfaces of the films in electrical communication with the seed layers.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a process of double-sided, high-density RF/DC network fabrication on a metal substrate is provided. The process includes extrusion of liquid crystal polymer (LCP) into holes formed in a substrate using a template to limit material contact to only the holes without a subsequent LCP thermal treatment. Films of LCP dielectric are laminated to each surface of the substrate in a single lamination operation. The films can be about ~2 mils in thickness, which is significant as this thickness overcomes a problem of potential LCP film protrusion/depression formation during extrusion. The LCP dielectric is then polished back down to the surfaces of the substrate leaving the holes filled with the LCP level or flush with the surfaces of the substrate. Additional LCP dielectric layers are then laminated to the surfaces of the substrate in a single lamination operation. Next, through-holes are created in the LCP dielectric by laser processing or other suitable processing operations from one or both sides to create via shapes conducive to double-sided sputter deposition. The through-holes are then plasma cleaned. At this point, thin atomic layer deposition (ALD) of alumina or other suitable materials is performed with respect to the interior surfaces of the through-holes. The ALD precedes metal deposition and effectively extends metal coverage of the metal deposition into the through-holes. High power impulse magnetron sputtering (HiPIMS) metal deposition is then performed from both sides of the substrate in sequential runs to barrel coat the dielectric through-holes with the deposited alumina. HiPIMS deposition has the throwing power needed to coat a predefined or sufficient amount of metal on the interior surfaces of the through-holes to achieve continuous plating throughout the through-holes.

Figure 1:
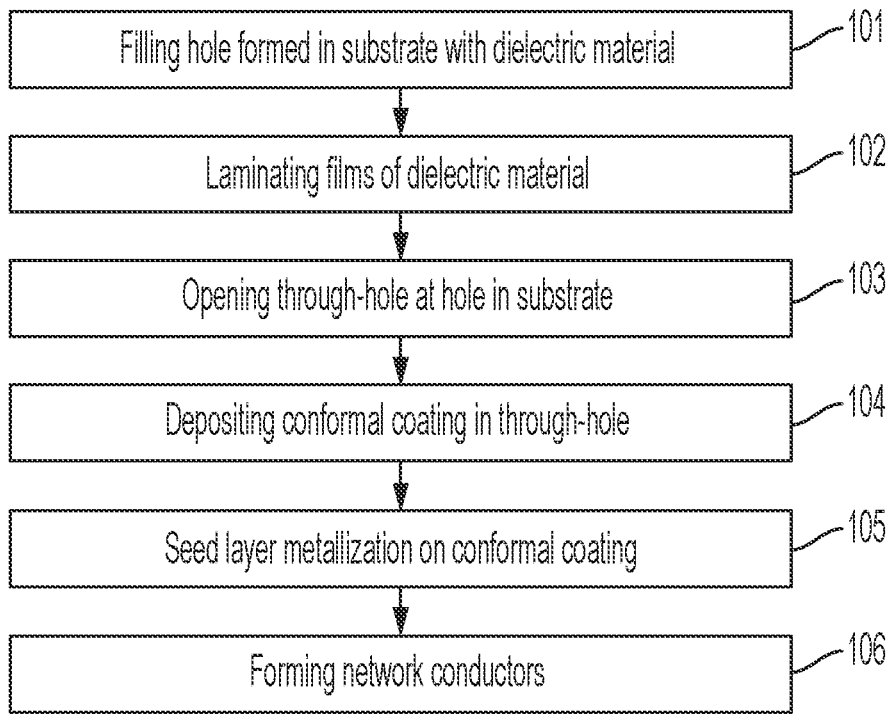
FIG. 1 is a flow diagram illustrating a conductive network fabrication process executed with respect to a substrate with a hole in accordance with embodiments.

With reference to FIG. 1, an RF/DC or conductive network fabrication process is provided and includes filling a hole formed in a substrate with dielectric material (101), laminating films of the dielectric material on either side of the substrate (102), opening a through-hole through the dielectric material at the hole (103), depositing a conformal coating of dielectric material onto an interior surface of the through-hole (104) and executing seed layer metallization onto the conformal coating in the through-hole to form a seed layer extending continuously along an entire length of the through-hole (105). The depositing of the conformal coating of operation 104 can include ALD of alumina and the executing of the seed layer metallization of operation 105 can include HiPIMS. In certain cases, the HiPIMS can be executed sequentially at opposite sides of the substrate so that the seed layer can be grown in stages in opposite directions although it is to be understood that this is not required and that the HiPIMS can be executed from one side only or from either side simultaneously. In some cases, the network fabrication process can further include forming network conductors on exterior surfaces of the films (106).

The conformal coating provides for defect sealing and high-strength adhesion with the substrate as well as a rigid surface within the through-hole that reduces the sticking coefficient of the sputtered metal of the HiPIMS. This effectively allows the metal atoms to travel farther down the through-hole and to thereby form the seed layer extending continuously along the entire length of the through-hole. The HiPIMS provides for low resistivity and low loss seed layer metallization.

In accordance with embodiments, the substrate can be made of at least one or more of metallic, inorganic, organic, ceramic, ferrite, garnet, invar, copper, alumina and aluminum nitride materials or combinations thereof. Also, the substrate can be a substrate that is formed to define an array of holes from a major surface of the substrate to an opposite major surface of the substrate. The holes can be formed by drilling or other suitable processes. The dielectric material used to fill the hole and form the films can be LCP or other suitable materials. In any case, the dielectric material used to fill the hole is flush with the major surfaces of the substrate. Also, surfaces of each of the films of the dielectric material are substantially flat. That is, the surfaces of the film of the dielectric material on the major surface of the substrate do not exhibit a depression or a protrusion at the hole. Similarly, the surfaces of the film of the dielectric material on the opposite major surface of the substrate do not exhibit a depression or a protrusion at the hole.

The flush condition of the dielectric material used to fill the hole with respect to the major surfaces of the substrate and the substantial flatness of the interior and exterior surfaces of each of the films of the dielectric material can significantly reduce patterning defects in the network conductors. Thus, since such patterning defects are reduced, short circuits, open circuit regions and size discrepancies in the network conductors can be avoided.

In accordance with embodiments, the through-hole can be opened by lasing the dielectric material at the hole or by other suitable processes from opposite sides of the hole and results in the through-hole having a high-aspect ratio. More particularly, as will be discussed below, the through-hole can have a bowtie shape whereby the diameter of the through-hole at a center of the substrate is slightly narrower than a diameter of the through-hole at the major surfaces of the substrate (e.g., about 150 microns). A thickness of the seed layer can about 10× a thickness of the conformal coating (e.g., about 1 micron vs. about 0.1 microns) and a thickness of at least the seed layer can be substantially uniform along the entire length of the through-hole.

Figure 2:
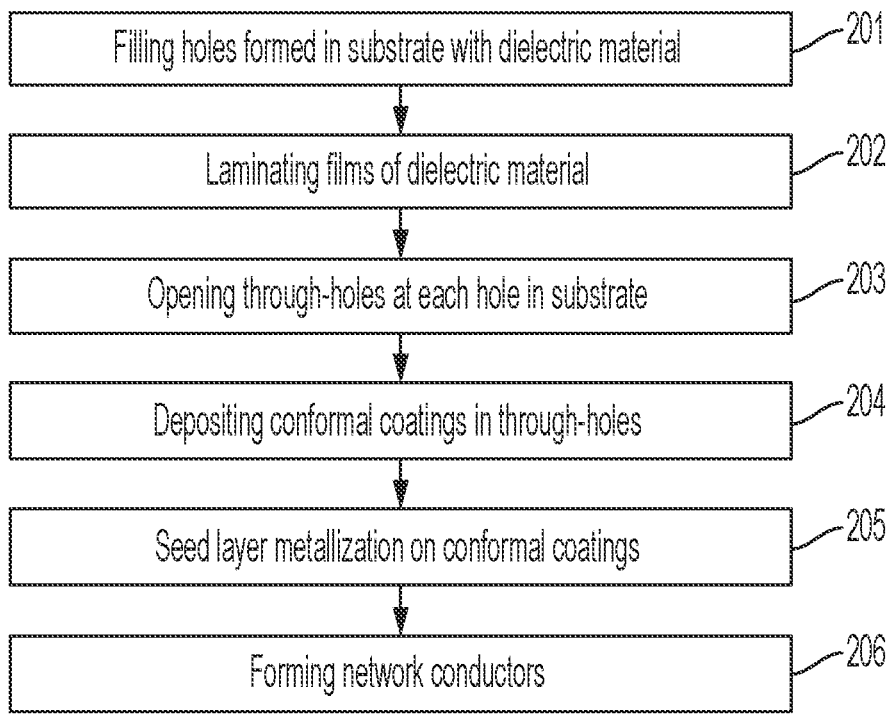
FIG. 2 is a flow diagram illustrating a conductive network fabrication process executed with respect to a substrate with multiple holes in accordance with embodiments.

With reference to FIG. 2, a network fabrication process is provided and includes filling holes formed in an array in a substrate with LCP (201), laminating films of LCP on either side of the substrate (202), lasing through-holes through the LCP at each of the holes (203), depositing, by atomic layer deposition (ALD), conformal coatings of alumina onto interior surfaces of each of the through-holes (204) and executing high power impulse magnetron sputtering (HiPIMS) to form, on the conformal coatings, seed layers extending continuously along entire lengths of each of the through-holes (205). In certain cases, the HiPIMS can be executed sequentially at opposite sides of the substrate so that the seed layer can be grown in stages in opposite directions although it is to be understood that this is not required and that the HiPIMS can be executed from one side only or from either side simultaneously. In some cases, the network fabrication process can further include forming network conductors on exterior surfaces of the films (206).

The conformal coating provides for defect sealing and high-strength adhesion with the substrate as well as a rigid surface within the through-hole that reduces the sticking coefficient of the sputtered metal of the HiPIMS. This effectively allows the metal atoms to travel farther down each of the through-holes and to thereby form the seed layers extending continuously along the entire lengths of each of the through-holes. The HiPIMS provides for low resistivity and low loss seed layer metallization.

In accordance with embodiments, the substrate can be made of at least one or more of metallic, inorganic, organic, ceramic, ferrite, garnet, invar, copper, alumina and aluminum nitride materials or combinations thereof. Also, the substrate can be a substrate that is formed to define the array of holes from a major surface of the substrate to an opposite major surface of the substrate. The holes can be formed by drilling or other suitable processes. The dielectric material used to fill the holes and form the films can be LCP or other suitable materials. In any case, the dielectric material used to fill the holes is flush with the major surfaces of the substrate. Also, interior and exterior surfaces of each of the films of the dielectric material are substantially flat. That is, both the interior and exterior surfaces of the film of the dielectric material on the major surface of the substrate do not exhibit a depression or a protrusion at the holes. Similarly, both the interior and exterior surfaces of the film of the dielectric material on the opposite major surface of the substrate do not exhibit a depression or a protrusion at the holes.

The flush condition of the dielectric material used to fill each of the holes with respect to the major surfaces of the substrate and the substantial flatness of the interior and exterior surfaces of each of the films of the dielectric material can significantly reduce patterning defects in the network conductors. Thus, since such patterning defects are reduced, short circuits, open circuit regions and size discrepancies in the network conductors can be avoided.

In accordance with embodiments, the through-holes can be opened by the lasing of the dielectric material at the holes or by other suitable processes from opposite sides of the holes and results in the through-holes having high-aspect ratios. More particularly, as will be discussed below, the through-holes can each have a bowtie shape whereby the diameter of each of the through-holes at a center of the substrate is slightly narrower than a diameter of each of the through-holes at the major surfaces of the substrate (e.g., about 150 microns). Respective thicknesses of the seed layers can about 10× respective thicknesses of the conformal coatings (e.g., about 1 micron vs. about 0.1 microns) and respective thicknesses of at least the seed layers can be substantially uniform along the entire lengths of each of the through-holes.

Figure 3:
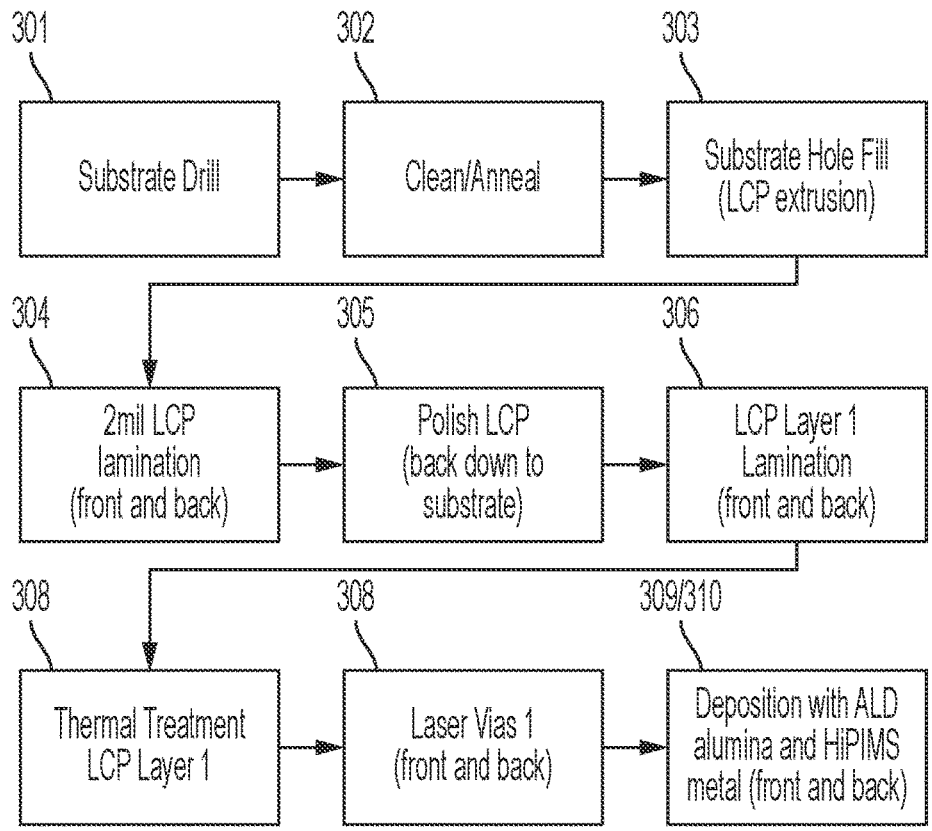
FIG. 3 is a flow diagram graphically illustrating a conductive network fabrication process in accordance with further embodiments.

With reference to FIG. 3 and in accordance with embodiments, a particular example of the network fabrication processes of FIGS. 1 and 2 is provided. As shown in FIG. 3, the substrate is drilled at operation 301 and cleaned and annealed at operation 302. At operation 303, LCP extrusion can be executed to fill the holes in the substrate and front and back LCP lamination can be executed at operation 304 to address any issues with LCP depressions or protrusions at each of the holes. The exterior LCP is then polished down to the major surfaces of the substrate at operation 305 to bring the LCP filling each of the holes into a flush relationship with the major surfaces of the substrate. At this point, front and back LCP films are laminated onto the major surfaces of the substrate operation 306 and a thermal treatment is executed at operation 307. Vias or through-holes are then formed by lasing through the LCP at each of the holes from the front and back at operation 308 and, with the through-holes formed, front and back deposition with ALD alumina to form conformal coatings and HiPIMS to form metallic seed layers are executed at operations 309/310.

As explained above, the conformal coatings formed by the front and back depositions of the ALD alumina provide rigid surfaces within each of the vias or through-holes and reduce the sticking coefficient of the sputtered metal of the HiPIMS. This effectively allows the metal atoms to travel farther down each of the through-holes and to thereby form the seed layers extending continuously along the entire lengths of each of the through-holes from the HiPIMS metal. Also, the polishing of operation 305 significantly reduces eventual patterning defects which can lead to short circuits, open circuit regions and size discrepancies. In addition, the polishing of operation 305 provides a planar LCP surface for high yielding photolithography processing.

Figure 4:
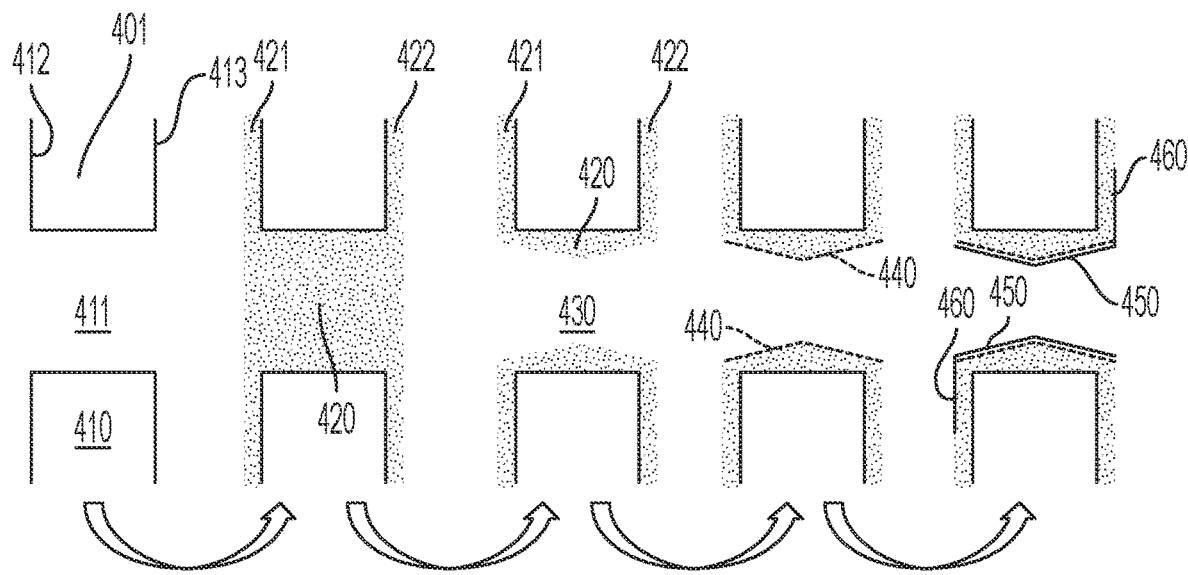
FIG. 4 is a graphical illustration of the conductive network fabrication process of FIG. 3 in accordance with further embodiments.

With reference to FIG. 4, a double-sided, high-density RF/DC network 401 is illustrated not to scale in various stages of completion of the exemplary network fabrication process of FIG. 3. As shown in FIG. 4, at an initial stage, a substrate 410 is provided and defines an array of holes 411 between opposite major surfaces 412 and 413. At a next stage, LCP filling 420 fills each of the holes 411 and LCP films 421 and 422 are provided on the opposite major surfaces 412 and 413. The LCP filling 420 is flush with the opposite major surfaces 412 and 413 and the interior and exterior surfaces of the LCP films 421 and 422 are substantially flat. At this point, high-aspect ratio through-holes 430 are formed to extend through the LCP films 421 and 422 and the LCP filling 420 at each of the holes 411. Subsequently, conformal coatings 440 of alumina are disposed on interior surfaces of each of the through-holes 430 and metallic seed layers 450 are disposed on the conformal coatings 440. Thicknesses of at least the metallic seed layers 450 are substantially uniform along the entire lengths of the through-holes 430. Network conductors 460 are then formed on the exterior surfaces of the LCP films 421 and 422 and in electrical communication with the metallic seed layers 450.

In accordance with embodiments, the substrate 410 can be made of at least one or more of metallic, inorganic, organic, ceramic, ferrite, garnet, invar, copper, alumina and aluminum nitride materials or combinations thereof. In accordance with further embodiments, the high-aspect ratio through-holes 430 can have a bowtie-shape that is relatively narrow at or near an axial center-point and relatively wide and opposite ends.

Figure 5:
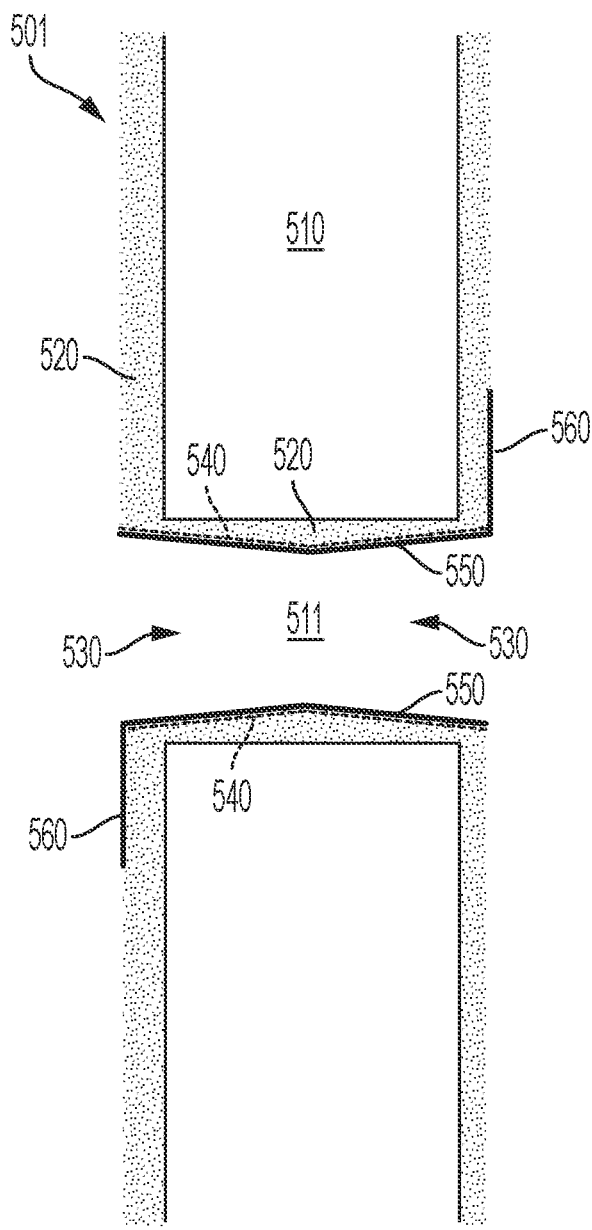
FIG. 5 is a side view of a double-sided, high-density radio frequency (RF)/direct current (DC) network in accordance with embodiments.

Thus, with reference to FIG. 5, at a final stage, a double-sided, high-density RF/DC network 501 includes a substrate 510 defining holes 511 and LCP 520 lining each of the holes 511 and forming substantially flat films on opposite surfaces of the substrate 510. The LCP 520 defines through-holes 530 at each of the holes 511. The through-holes 530 can have an aspect ratio of about 8-12:1 (axial length:diameter) or, in some cases, an aspect ratio of about 10:1. The double-sided, high-density RF/DC network 501 further includes conformal coatings 540 of alumina respectively disposed on the LCP 520 in each of the through-holes 530 and seed layers 550 respectively disposed on the conformal coatings 540 to respectively extend continuously along entire lengths of the through-holes 530. Thicknesses of at least the seed layers 550 are substantially uniform along the entire lengths of the through-holes 530. Network conductors 560 can be disposed on exterior surfaces of the substantially flat films of the LCP 520 in electrical communication with the seed layers 550.

In accordance with embodiments, the substrate 510 can be made of at least one or more of metallic, inorganic, organic, ceramic, ferrite, garnet, invar, copper, alumina and aluminum nitride materials or combinations thereof. In accordance with further embodiments, the high-aspect ratio through-holes 430 can have a bowtie-shape that is relatively narrow at or near an axial center-point and relatively wide and opposite ends.

Technical effects and benefits of the present invention arise from the various processes used as described above. Polishing non-planarity in LCP dielectric over the through-holes significantly reduces patterning defects which otherwise can lead to shorts, opens and size discrepancies. Polishing also allows for a simplified LCP lamination/extrusion process thus reducing exposure to long, complicated dielectric layer processes. The alumina conformal coating formed by the ALD on LCP in the through-holes provides a rigid surface and reduces a sticking coefficient of sputtered metal allowing atoms to travel farther down the wall of a high aspect ratio through-hole. The HiPIMS provides enhanced throwing power to cover sidewalls farther into the through-holes during seed layer metallization.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A conductive network fabrication process, comprising:
   filling a hole formed in a substrate with dielectric material;
   laminating films of the dielectric material on either side of the substrate;
   opening a through-hole through the dielectric material at the hole;
   depositing a conformal coating of dielectric material onto an interior surface of the through-hole; and
   executing seed layer metallization onto the conformal coating in the through-hole to form a seed layer extending continuously along an entire length of the through-hole.

2. The conductive network fabrication process according to claim 1, wherein the dielectric material filling the hole is flush with substrate surfaces and interior and exterior surfaces of each of the films are substantially flat.

3. The conductive network fabrication process according to claim 1, wherein the through-hole is a high-aspect ratio through-hole.

4. The conductive network fabrication process according to claim 1, wherein the opening of the through-hole comprises lasing.

5. The conductive network fabrication process according to claim 1, wherein the depositing of the conformal coating comprises atomic layer deposition (ALD) of alumina.

6. The conductive network fabrication process according to claim 1, wherein the executing of the seed layer metallization comprises high power impulse magnetron sputtering (HiPIMS).

7. The conductive network fabrication process according to claim 6, wherein the HiPIMS is executed sequentially at opposite sides of the substrate.

8. The conductive network fabrication process according to claim 1, wherein a thickness of the seed layer is about 10× a thickness of the conformal coating.

9. The conductive network fabrication process according to claim 1, wherein a thickness of at least the seed layer is substantially uniform along the entire length of the through-hole.

10. The conductive network fabrication process according to claim 1, further comprising forming network conductors on exterior surfaces of the films in electrical communication with the seed layer.

11. A conductive network fabrication process, comprising:
    filling a hole formed in a substrate with dielectric material;
    laminating films of the dielectric material on either side of the substrate;
    opening a through-hole through the dielectric material at the hole;
    depositing a coating of dielectric material onto an interior surface of the through-hole; and
    metallizing the coating in the through-hole to form a seed layer extending continuously along an entire length of the through-hole.

12. The conductive network fabrication process according to claim 11, wherein the dielectric material filling the hole is flush with substrate surfaces and interior and exterior surfaces of each of the films are substantially flat.

13. The conductive network fabrication process according to claim 11, wherein the through-hole is a high-aspect ratio through-hole.

14. The conductive network fabrication process according to claim 11, wherein the opening of the through-hole comprises lasing.

15. The conductive network fabrication process according to claim 11, wherein the depositing of the coating comprises atomic layer deposition (ALD) of alumina.

16. The conductive network fabrication process according to claim 11, wherein the metallizing comprises high power impulse magnetron sputtering (HiPIMS).

17. The conductive network fabrication process according to claim 16, wherein the HiPIMS is executed sequentially at opposite sides of the substrate.

18. The conductive network fabrication process according to claim 11, wherein a thickness of the seed layer is about 10× a thickness of the coating.

19. The conductive network fabrication process according to claim 11, wherein a thickness of at least the seed layer is substantially uniform along the entire length of the through-hole.

20. The conductive network fabrication process according to claim 11, further comprising forming network conductors on exterior surfaces of the films in electrical communication with the seed layer.

\* \* \* \* \*